United States Patent
Ho et al.

(10) Patent No.: US 7,924,568 B2
(45) Date of Patent: Apr. 12, 2011

(54) HEAT SINK DEVICE WITH A SHIELDING MEMBER

(75) Inventors: Yu-Hua Ho, Taipei Hsien (TW); Ting-Wang Lin, Taipei Hsien (TW); Fu-Chin Yeh, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 68 days.

(21) Appl. No.: 12/494,259

(22) Filed: Jun. 29, 2009

(65) Prior Publication Data
US 2010/0142153 A1   Jun. 10, 2010

(30) Foreign Application Priority Data

Dec. 5, 2008   (CN) .......................... 2008 2 0303134

(51) Int. Cl.
*H05K 7/20* (2006.01)
(52) U.S. Cl. .................. 361/710; 361/679.54; 361/704; 361/719; 361/816; 165/80.3; 257/706
(58) Field of Classification Search ........ 361/679.46–679.54, 688, 689, 361/700–714, 717–724, 752, 753, 796, 816, 361/818; 257/706–727; 165/80.2, 80.3, 165/80.4, 104.33, 104.34, 185; 174/16.3, 174/252, 35 R, 35 GC, 50, 54, 50.51, 50.52
See application file for complete search history.

(56) References Cited

U.S. PATENT DOCUMENTS

| | | | |
|---|---|---|---|
| 5,357,404 A * | 10/1994 | Bright et al. ................. | 361/818 |
| 5,375,652 A | 12/1994 | Matsunaga et al. | |
| 5,541,811 A * | 7/1996 | Henningsson et al. ....... | 361/704 |
| 5,566,052 A * | 10/1996 | Hughes ......................... | 361/704 |
| 5,717,248 A * | 2/1998 | Neumann et al. ............ | 257/718 |
| 6,205,026 B1 * | 3/2001 | Wong et al. .................. | 361/704 |
| 6,507,101 B1 * | 1/2003 | Morris ......................... | 257/706 |
| 7,167,379 B2 * | 1/2007 | DiBene et al. ................ | 361/785 |
| 7,371,965 B2 * | 5/2008 | Ice ................................. | 174/50 |
| 7,573,709 B2 * | 8/2009 | Gilliland et al. ......... | 361/679.54 |
| 2004/0052064 A1 * | 3/2004 | Oliver et al. .................. | 361/816 |
| 2007/0086170 A1 * | 4/2007 | Liang .......................... | 361/719 |

FOREIGN PATENT DOCUMENTS

JP   2009283768 A * 12/2009

\* cited by examiner

*Primary Examiner* — Michael V Datskovskiy
(74) *Attorney, Agent, or Firm* — Raymond J. Chew

(57) ABSTRACT

A heat sink device mounted on a circuit board including an electronic component includes a heat sink to dissipate heat generated by the electronic component and a shielding member electrically connecting the circuit board and the heat sink to prevent the electronic component from electromagnetic interference (EMI). The heat sink includes a base, a plurality of heat fins extending upwardly from the base, and a plurality of receiving grooves defined in the base. The plurality of receiving grooves are arranged in rows around the plurality of heat fins. The shielding member includes a plurality of contact plates abutting against the circuit board and a plurality of receiving plates received in the plurality of receiving grooves.

4 Claims, 3 Drawing Sheets

HEAT SINK DEVICE WITH A SHIELDING MEMBER

BACKGROUND

1. Technical Field

The present disclosure generally relates to heat sink devices, and more particularly to a heat sink device with a shielding member that provides electromagnetic interference (EMI) shielding.

2. Description of Related Art

FIG. 3 is an isometric view of a commonly used heat sink 10. The heat sink 40 can be mounted on an electronic component (not shown). The heat sink 40 comprises a plurality of heat fins 12 to dissipate heat generated by the electronic component. However, because the electronic component generally comprises high frequency circuits (HFC), digital signal circuits (DSC), and analog signal circuits (ASC), electromagnetic interference (EMI) often occurs between neighboring electronic components due to inductive coupling. In addition, the heat sink 10 does not shield the electronic component from external EMI. Therefore, the effective performance of the electronic component may be disrupted, obstructed, or degraded by EMI.

Therefore, a need exists in the industry to overcome the described limitations.

DETAILED DESCRIPTION

Figure 1:
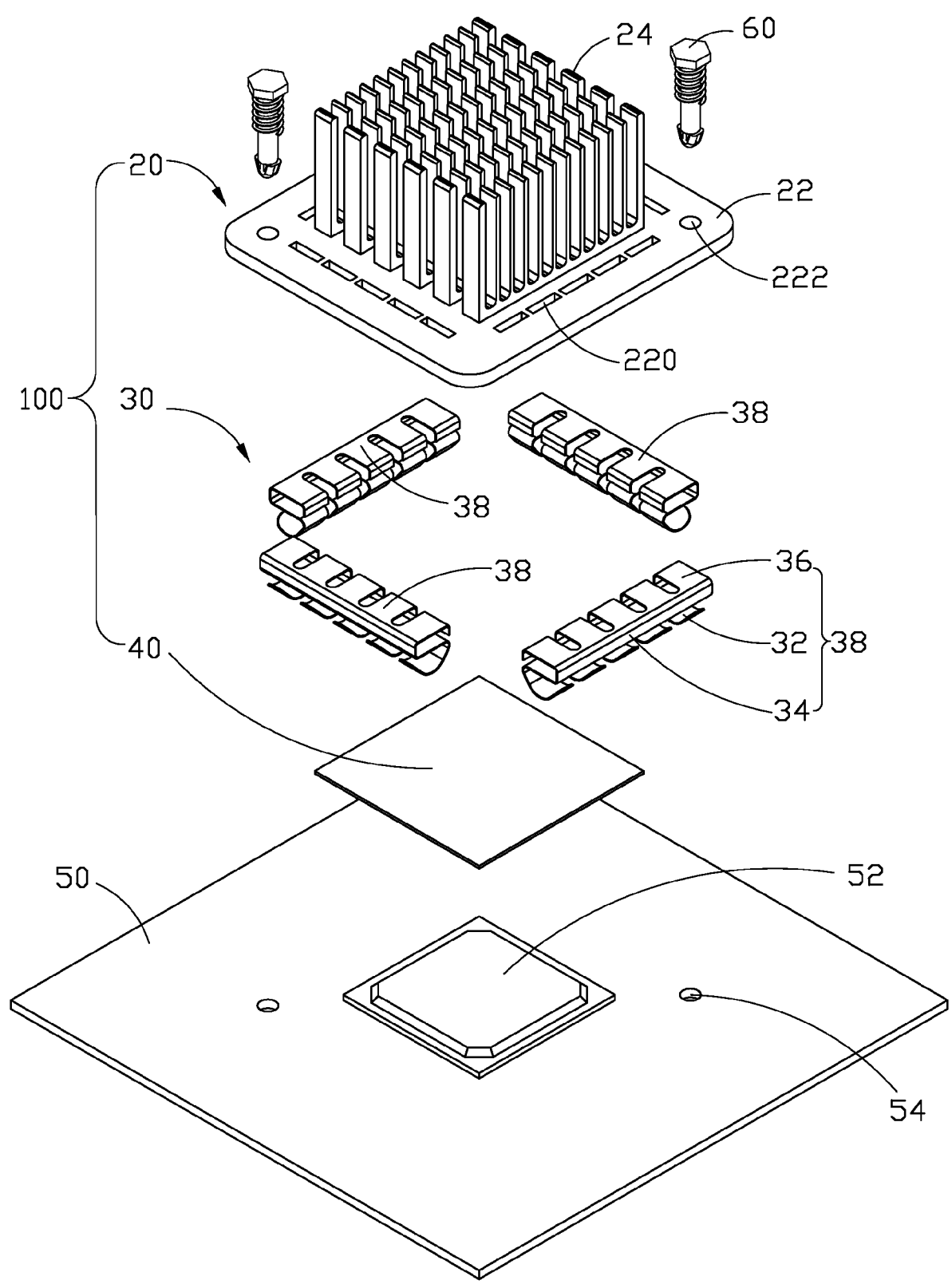
FIG. 1 is an exploded, isometric view of a heat sink device of the disclosure, together with a circuit board.

Referring to FIG. 1, a heat sink device 100 of an exemplary embodiment is mounted on a circuit board 50, such as a printed circuit board. The heat sink device 100 includes a heat sink 20, a shielding member 30, and a heat conducting film 40.

The circuit board 50 includes an electronic component 52 and a pair of first mounting holes 54 extending through the circuit board 50.

The heat sink 20 includes a base 22 and a plurality of heat fins 24 extending upwardly from the base 22. The plurality of heat fins 24 are integrally formed with the base 22, and arranged in rows and columns.

Alternatively, the heat fins 24 may be heat pins, heat dissipating protuberances, heat plates, or other heat dissipating structures known in the art.

The base 22 includes a plurality of receiving grooves 220 and a pair of second mounting holes 222 corresponding to the first mounting holes 54. The second mounting holes 222 are positioned in a pair of diagonal corners of the base 22. In the illustrated embodiment, the receiving grooves 220 are arranged in four rows around the heat fins 24.

The shielding member 30 electrically connects the heat sink 20 and the circuit board 50 to prevent the electronic component 52 from electromagnetic interference (EMI). The shielding member 30 includes a plurality of resilient metal plates 38. A cross-section of each of the plurality of metal plates 38 is substantially S-shaped. Each of the plurality of metal plates 38 includes a main body 34, a plurality of curved contact plates 32 extending from a first side of the main body 34, and a plurality of curved receiving plates 36 extending from a second side of the main body 34 opposite to the first side. An extending direction of each of the plurality of receiving plates 36 is opposite to an extending direction of each of the plurality of contact plates 32. The plurality of receiving plates 36 are received in the corresponding receiving grooves 220 to attach the metal plate 38 to the heat sink 20.

In the illustrated embodiment, the shielding member 30 includes four metal plates 38. Alternatively, the shielding member 30 may include one, two, or three metal plates 38.

Alternatively, one contact plate 32 and one receiving plate 36 are integrally formed with one main body 34 to form one metal plate 38.

The heat conducting film 40 may be made of silicon rubber, aluminum oxide, aluminum coil, or other thermal conductive materials to timely conduct away heat generated by the electronic component 52.

Figure 2:
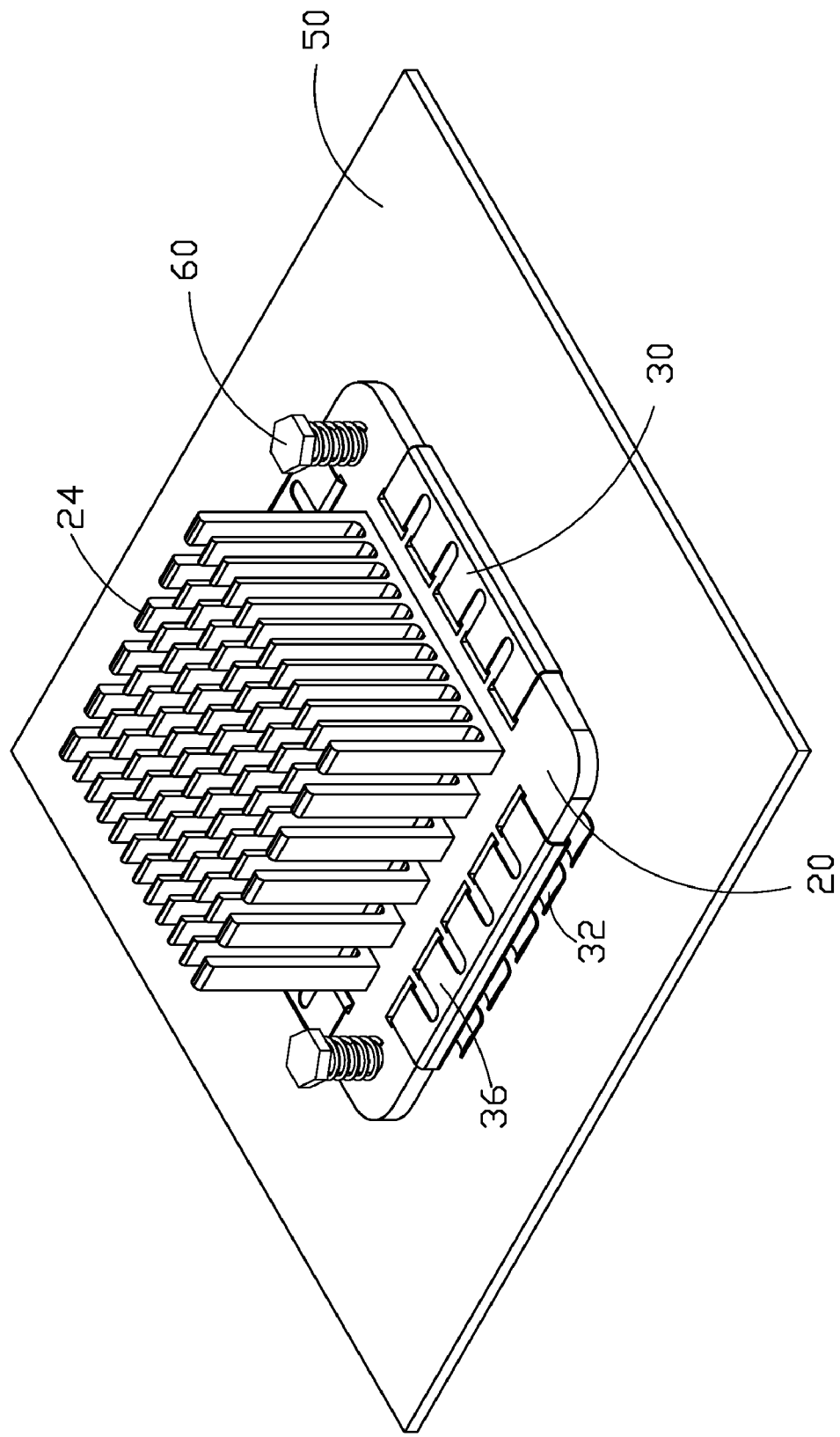
FIG. 2 is an assembled view of FIG. 1.
Figure 3:
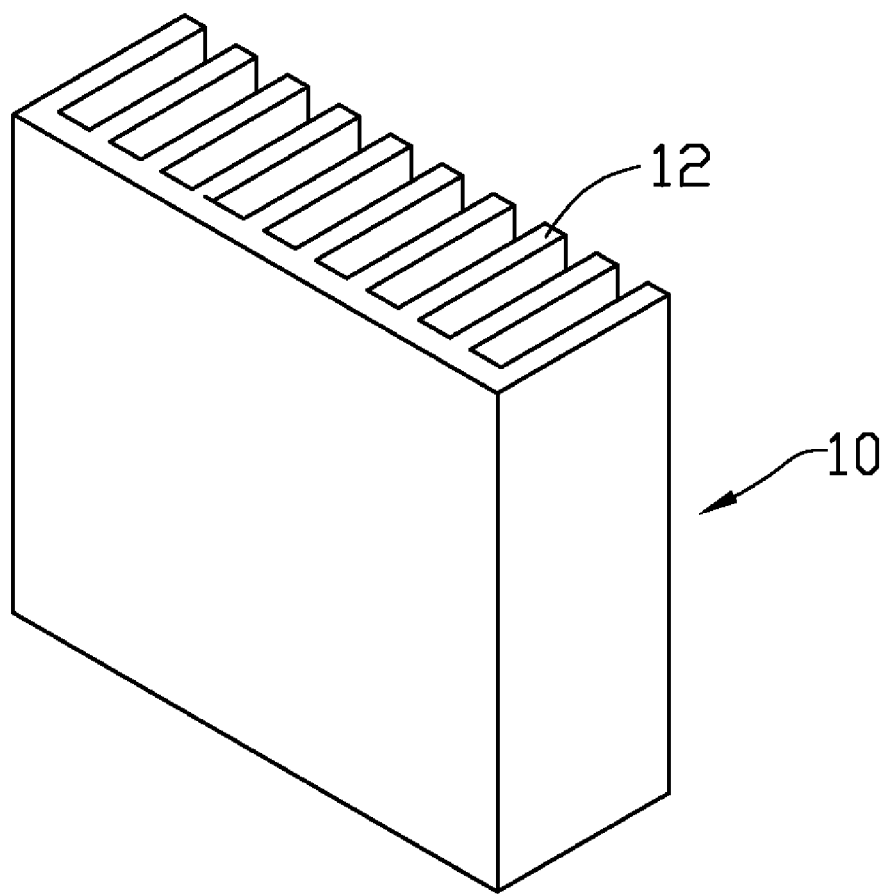
FIG. 3 is an isometric view of a commonly used heat sink.

Referring to FIG. 2, in assembly, the heat conducting film 40 is attached to a bottom surface of the heat sink 20. The receiving plates 36 of the shielding member 30 are received in the receiving grooves 220 of the base 20. Thus, the heat sink 20, the shielding member 30, and the heat conducting film 40 are assembled. Then, a pair of fasteners 60 is mounted in the first mounting holes 54 through the second mounting hole 222, respectively, so that the assembly of the heat sink 20, the shielding member 30, and the heat conducting film 40 is mounted on the circuit board 50 over the electronic component 52. In this assembled state, the heat conducting film 40 abuts against the electronic component 52, and the plurality of contact plates 32 of the shielding member 30 abut against the circuit board 50.

Because the heat sink device 100 comprises the shielding member 30 and the heat sink 20, the heat sink device 100 not only protects the electronic component 52 from EMI, but also effectively dissipates heat generated by the electronic component 52.

While an embodiment of the present disclosure has been described, it should be understood that it has been presented by way of example only and not by way of limitation. Thus the breadth and scope of the present disclosure should not be limited by the above-described exemplary embodiments, but should be defined only in accordance with the following claims and their equivalents.

What is claimed is:

1. A heat sink device mounted on a circuit board comprising an electronic component, the heat sink device comprising:
    a heat sink to dissipate heat generated by the electronic component, the heat sink comprising a base, a plurality of heat fins extending upwardly from the base, and a plurality of receiving grooves defined in the base, wherein the plurality of receiving grooves are arranged in rows around the plurality of heat fins; and
    a shielding member electrically connecting the circuit board and the heat sink to prevent the electronic component from electromagnetic interference (EMI), the shielding member comprising at least one main body, at least one contact plate abutting against the circuit board and at least one receiving plate received in the plurality of receiving grooves, wherein at least one contact plate and receiving plate are integrally formed with the at least one main body to form a metal plate.

2. The heat sink device as recited in claim 1, wherein the at least one contact plate extends from a first side of the one main body, and the at least one receiving plate extends from a second side of the one main body opposite to the first side.

3. The heat sink device as recited in claim 2, wherein an extending direction of the at least one contact plate is opposite to an extending direction of the at least one receiving plate.

4. The heat sink device as recited in claim 1, wherein a cross-section of the metal plate is substantially S-shaped.

* * * * *